United States Patent
Becker et al.

(10) Patent No.: US 9,972,782 B2
(45) Date of Patent: May 15, 2018

(54) FORMULATIONS CONTAINING CONDUCTIVE POLYMERS AND USE THEREOF IN ORGANIC ELECTRONIC DEVICES

(71) Applicant: Merck Patent GmbH, Darmstadt (DE)

(72) Inventors: Heinrich Becker, Ober-Ramstadt (DE); Susanne Heun, Bad Soden (DE)

(73) Assignee: Merck Patent GmbH, Darmstadt (DE)

( * ) Notice: Subject to any disclaimer, the term of this patent is extended or adjusted under 35 U.S.C. 154(b) by 0 days. days.

(21) Appl. No.: 14/429,890

(22) PCT Filed: Sep. 5, 2013

(86) PCT No.: PCT/EP2013/002673
§ 371 (c)(1),
(2) Date: Mar. 20, 2015

(87) PCT Pub. No.: WO2014/048543
PCT Pub. Date: Apr. 3, 2014

(65) Prior Publication Data
US 2015/0228902 A1    Aug. 13, 2015

(30) Foreign Application Priority Data

Sep. 25, 2012   (EP) .................................. 12006695

(51) Int. Cl.
*H01M 4/88*   (2006.01)
*H01L 51/00*   (2006.01)
(Continued)

(52) U.S. Cl.
CPC ...... *H01L 51/0035* (2013.01); *C08G 73/0266* (2013.01); *C08G 73/0611* (2013.01);
(Continued)

(58) Field of Classification Search
CPC .............................. C08L 65/00; H01B 1/122
(Continued)

(56) References Cited

U.S. PATENT DOCUMENTS 5,935,405 A * 8/1999 Wolf ...................... H05K 3/108
  205/122
7,910,687 B2   3/2011 Büsing et al.
(Continued)

FOREIGN PATENT DOCUMENTS

EP   0593111 A1   4/1994
EP   1773102 A1   4/2007
(Continued)

OTHER PUBLICATIONS

International Search Report for PCT/EP2013/002673 dated Feb. 4, 2014.
(Continued)

*Primary Examiner* — Khanh Tuan Nguyen (57) ABSTRACT

The invention relates to formulations containing doped conductive polymers, which due to outstanding hole injection characteristics and high conductivity are very suitable for use in organic electronic devices, preferably in organic electroluminescent devices, in particular in the buffer layers thereof. Thus the invention further relates to the use of the formulations according to the invention in organic electronic devices, preferably in electroluminescent devices, in particular in the buffer layers thereof.

9 Claims, 4 Drawing Sheets

3 nm/150 nm — Ba/Al 80 nm — 20% of T1 in 40% of M1 and 40% of M2

[20 nm — HIL-012]

80 nm — PANI-In-PSSH (51) Int. Cl.
*C08G 73/02* (2006.01)
*C08G 73/06* (2006.01)
*C08L 65/00* (2006.01)
*C08L 79/02* (2006.01)
*C08L 79/04* (2006.01)
*H01L 51/50* (2006.01)
*C08G 61/12* (2006.01)

(52) U.S. Cl.
CPC ............ *C08L 65/00* (2013.01); *C08L 79/02* (2013.01); *C08L 79/04* (2013.01); *H01L 51/0037* (2013.01); *H01L 51/506* (2013.01); *C08G 61/126* (2013.01); *C08G 2261/1424* (2013.01); *C08G 2261/512* (2013.01); *C08G 2261/794* (2013.01); *C08G 2261/95* (2013.01); *H01L 51/5016* (2013.01); *H01L 51/5088* (2013.01)

(58) Field of Classification Search
USPC .............................................. 252/500, 182.1
See application file for complete search history.

(56) References Cited

U.S. PATENT DOCUMENTS

| | | | | |
|---|---|---|---|---|
| 7,989,533 | B2* | 8/2011 | Wessling | C08L 65/00 |
| | | | | 524/434 |
| 8,289,677 | B2 | 10/2012 | Kobayakawa et al. | |
| 8,804,312 | B2 | 8/2014 | Sugawara et al. | |
| 2005/0072021 | A1 | 4/2005 | Steiger et al. | |
| 2005/0224788 | A1* | 10/2005 | Hsu | B82Y 10/00 |
| | | | | 257/40 |
| 2006/0175582 | A1* | 8/2006 | Hammond | C08L 65/00 |
| | | | | 252/500 |
| 2007/0045591 | A1* | 3/2007 | Hsu | H01B 1/122 |
| | | | | 252/500 |
| 2011/0248223 | A1* | 10/2011 | Zheng | C09D 5/24 |
| | | | | 252/519.21 |
| 2012/0145968 | A1* | 6/2012 | Shimizu | C08K 7/24 |
| | | | | 252/511 |
| 2012/0217491 | A1 | 8/2012 | Osako et al. | |

FOREIGN PATENT DOCUMENTS

| | | | | |
|---|---|---|---|---|
| EP | 2062870 | A1 | 5/2009 | |
| JP | 201040776 | A | 2/2010 | |
| JP | 2010182426 | A | 8/2010 | |
| JP | 201121064 | A | 2/2011 | |
| WO | WO 9216950 | A1 * | 10/1992 | ............ H01B 1/127 |
| WO | WO-03/038923 | A1 | 5/2003 | |
| WO | WO-04/029133 | A1 | 4/2004 | |
| WO | WO-2004029128 | A2 | 4/2004 | |
| WO | WO-2004/037887 | A2 | 5/2004 | |
| WO | WO-2007002737 | A2 | 1/2007 | |
| WO | WO-2007020100 | A1 | 2/2007 | |
| WO | WO-2010/141129 | A1 | 12/2010 | |
| WO | WO-2011052625 | A1 | 5/2011 | |
| WO | WO 2012/059215 | * | 5/2012 | ............ H01B 1/12 |

OTHER PUBLICATIONS

Inoue et al., "One-Step Chemical Synthesis of Doped Polythiophene by Use of Copper(II) Perchlorate as an Oxidant", *Synthetic Metals*, vol. 24, pp. 223-229 (1988).
English Translation of Japanese Office Action for Japanese Application No. 2015-533470, dated Dec. 19, 2017.

* cited by examiner

FORMULATIONS CONTAINING CONDUCTIVE POLYMERS AND USE THEREOF IN ORGANIC ELECTRONIC DEVICES

CROSS-REFERENCE TO RELATED APPLICATIONS

This application is a national stage application (under 35 U.S.C. § 371) of PCT/EP2013/002673, filed Sep. 5, 2013, which claims benefit of European Application No. 12006695.6, filed Sep. 25, 2012, both of which are incorporated herein by reference in their entirety.

The present invention relates to formulations comprising doped, conductive polymers which, owing to their excellent hole-injection properties and their high conductivities, are very suitable for use in organic, electronic devices, preferably in electroluminescent devices, in particular in buffer layers thereof. The present invention thus also relates to the use of the formulations according to the invention in organic, electronic devices, preferably in electroluminescent devices, in particular in buffer layers thereof. Thus, the conductive polymers exhibit excellent properties as buffer layer in photo-voltaics, phototherapy and sensor technology. The polymers have a broad spectral window and good film-formation properties. The materials are usually processed as aqueous dispersion, but it is likewise possible to process the materials as solution from organic solvents or water.

Doped conductive polymers are known and have long been used in corrosion protection, in antistatics, in printed electronics and in organic electroluminescent devices. Their use in OLEDs (organic light emitting diodes) and PLEDs (polymeric light emitting diodes) has particular importance.

The conductive polymers employed are usually polyanilines, polyaniline/indium complexes, polythiophenes, polythienothiophenes, polypyrroles and oligoanilines. These may be doped by Brönstedt acids (polymeric acids, monomeric acids, and by covalently bonded acid groups).

The best-known doped conductive polymers include poly (3,4-ethylenedioxythiophene) (PEDOT) and polyaniline (PANI).

Dispersions of poly(3,4-ethylenedioxythiophene) (PEDOT) which are doped, inter alia, with polymeric sulfonic acids are disclosed, for example, in EP 0593111 A1. Commercial, aqueous PEDOT dispersions are obtainable, for example, from Heraeus under the trade name Clevios and from Agfa-Gevaert under the trade name Orgacon.

Dispersions of polyaniline (PANI) and a polymeric sulfonic acid to which indium has been added are disclosed, for example, in WO 2007/020100. This document furthermore describes polypyrroles and polythiophenes (PEDOT derivatives) with added indium. This document likewise describes dispersions of these materials and the use thereof in OLEDs. However, the opto-electronic capability and in particular the optical transparency of the material systems described are not discussed.

Furthermore, conductive polythieno[3,4-b]thiophenes, polythieno[3,2-b]thiophenes and polypyrroles are known for OLED applications. These are described, for example, in WO 2010/141129. Furthermore, the use of fluorinated organic Brönstedt acids is known, as disclosed, for example, in WO 04/029128 and WO 04/029133. Furthermore, oligoanilines are disclosed, for example, in EP 2062870 and in EP 1773102.

According to the prior art, the buffer layers used are suitable for conducting the electrical current, injecting holes and compensating for unevenness in thin-film electronic applications, in particular in OLEDs. However, the materials currently frequently only exhibit inadequate optical transparency and therefore result in unacceptably large efficiency losses due to light absorption.

Surprisingly, it has now been found that the optical properties of these conductive polymers can be improved while retaining the other functionality if an oxidant is additionally added to these materials after the preparation of solution or dispersion.

The present application thus relates to a formulation comprising at least one doped, conductive polymer, at least one oxidant and at least one solvent.

The formulation according to the invention preferably comprises a doped, conductive polymer.

The doped, conductive polymer employed can be all polymers which are known to the person skilled in the art for the said application and are suitable.

Preferred conductive polymers are polythiophenes, such as, for example, poly(3,4-ethylenedioxythiophene), and polythiophene derivatives, such as, for example, polythienothiophenes, polyanilines and polyaniline derivatives, such as, for example, polyaniline/indium complexes, polypyrroles and oligoanilines. These may be doped by Brönstedt acids (inorganic and organic acids, polymeric acids, monomeric acids, and by covalently bonded acid groups). Particular preference is given to poly(3,4-ethylenedioxythiophene) and polyaniline which are doped by addition of polysulfonic acids.

The content of the at least one doped, conductive polymer in the formulation is preferably in the range from 0.001 to 30% by weight, particularly preferably in the range from 0.01 to 15% by weight and very particularly preferably in the range from 0.1 to 6% by weight.

The formulation according to the invention preferably comprises an oxidant.

The oxidant employed can be all oxidants known to the person skilled in the art.

Preferred oxidants are organic and inorganic peroxides (for example hydrogen peroxide and t-butyl hydroperoxide), peracids (for example m-chloroperoxobenzoic acid and peracetic acid), persulfates (for example peroxodisulfate and persulfate), perborates, metal salts (for example potassium permanganate, potassium hexacyanoferrate(III), iron(III) chloride and chromates), derivatives of halogen oxyacid (for example perchlorates, hypochlorites, bromates and periodates), nitrates, halogens (for example chlorine, bromine, fluorine and iodine), ozone, nitrogen oxides, nitroso compounds and oxygen.

The content of oxidant in the formulation is preferably in the range from 0.001 to 5% by weight, particularly preferably in the range from 0.05 to 2% by weight and very particularly preferably in the range from 0.01 to 1% by weight.

The weight ratio of doped, conductive polymer to oxidant in the formulation is preferably in the range from 1000:1 to 1:10, particularly preferably in the range from 500:1 to 1:5 and very particularly preferably in the range from 100:1 to 1:1.

In a further embodiment, the oxidant is added in the form of a gas, which is no longer present in the final formulation.

The formulation according to the invention preferably comprises a solvent.

The solvent employed can likewise be all solvents which are known to the person skilled in the art and are suitable for the conductive polymers. A solvent in the present application is taken to mean not only those in which all components of the formulation are soluble, but also those in which one or more components of the formulation are insoluble or not fully soluble, so that the formulation is, for example, in the form of a dispersion.

Preferred solvents are: water, alcohols (for example methanol, ethanol, isopropanol, t-butanol and cyclohexanol), alkanes (for example heptane), cycloalkanes (for example cyclohexane), alkenes (for example 1-heptene), alkynes, ethers (for example diethyl ether, t-butyl methyl ether and tetra-hydrofuran), esters (for example methyl benzoate), halogenated hydrocarbons (for example dichloromethane and trichloromethane), aromatic compounds (for example toluene, anisole, methylanisole, chlorobenzene, methylnaphthalene and tetralin), lactones (for example 4-butyrolactone), carbonates (for example ethylene carbonate), sulfoxides (for example dimethyl sulfoxide), nitro compounds (for example nitromethane), nitriles (for example acetonitrile), ketones (for example acetone and butanone), carboxamides (for example dimethylformamide) and urea derivatives (for example 1,3-dimethyl-2-imidazolidone). It is likewise possible to employ mixtures of these solvents. However, the solvent is particularly preferably water.

The content of solvent in the formulation is preferably in the range from 65 to 99.99% by weight, particularly preferably in the range from 83 to 99.9% by weight and very particularly preferably in the range from 93 to 99% by weight.

The formulations according to the invention can be obtained, for example, by dissolving or dispersing the doped, conductive polymer in the at least one solvent and adding the oxidant to the solution or dispersion or (in the case of gases) introducing the oxidant by passing through.

In a further embodiment, the oxidation can also be carried out electro-chemically.

In addition, the formulations according to the invention are used in organic, electronic devices. The present application thus also relates to the use of the formulations according to the invention in organic, electronic devices.

The organic, electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic, light-emitting transistor (O-LET), an organic solar cell (O-SC), an organic, optical detector, an organic photoreceptor, an organic field-quench device (O-FQD), an organic, light-emitting electrochemical cell (OLEC) or an organic laser diode (O-laser).

It is preferred in accordance with the invention for the doped conductive polymer to be in the form of a layer (or in a layer) in the electronic device. The layer thickness here is preferably in the range from 1 to 1000 nm, particularly preferably in the range from 5 to 500 nm and very particularly preferably in the range from 10 to 200 nm.

The layer can be obtained, for example, by applying the formulation according to the invention as dispersion or solution and subsequently removing the at least one solvent.

The solution can be applied here by all methods which are known to the person skilled in the art and are suitable for this purpose. However, the application is preferably carried out by spin coating or by means of any desired printing process, such as, for example, screen printing, flexographic printing or offset printing, but particularly preferably LITI (light induced thermal imaging, thermal transfer printing) or ink-jet printing. Preference is likewise given to continuous coating methods, such as, for example, knife coating, dip coating, roll-to-roll processes and coating by atomisation technique (airbrush).

The removal of the solvent can also be carried out by all methods known to the person skilled in the art. However, the solvent is preferably removed at elevated temperature and/or under reduced pressure. The drying by means of (N)IR treatment, as disclosed, for example, in WO 03/038923 A1, can also be inexpensive and time-saving, especially in production.

In general, the layers are dried at temperatures in the range from 20° C. to 300° C., preferably in the range from 80° C. to 250° C., particularly preferably in the range from 100° C. to 240° C. and very particularly preferably in the range from 140° C. to 220° C. The drying here is preferably carried out at atmospheric pressure (1013 mbar). However, it is also possible to carry out the drying under reduced pressure. The heat-drying times here are preferably greater than 2 minutes, particularly preferably in the range from 3 minutes to 1 hour and very particularly preferably in the range from 5 minutes to 20 minutes.

The layer obtained from the formulation according to the invention is preferably employed as buffer layer and/or hole-injection layer in electroluminescent devices, preferably organic electroluminescent devices (OLEDs) or polymeric electroluminescent devices (PLEDs).

It has been found here that the use of the formulation according to the invention widens the spectral window of optical transmissivity, but that the other parameters, such as, for example, hole-injection properties, wetting properties, conductivity, viscosity, viscoelastic behavior and pH of the materials, do not change adversely. In particular, the absorption at the long-wave end of the visual spectrum is significantly less. The layers produced exhibit increased transparency, while the other properties, such as, for example, thickness, mechanical hardness, work function and surface roughness, remain comparable.

The properties in opto-electronic thin-film applications profit from the widened optical window. This applies, in particular, to organic light-emitting diodes and organic solar cells. In particular, organic light-emitting diodes exhibit higher efficiency in the red spectral region at the same time as a good lifetime. Particularly in the case of multilayered devices and/or white light-emitting diodes, the larger spectral range is of advantage, since none of the colouring, spectral components is filtered out selectively. This is particularly important if the efficiency is to be increased for lighting units by various methods for improving the coupling-out of light. The emitted photons pass through the individual layers of the components multiple times here, which, in the case of red absorption of the buffer layer, results in selective loss of the red, spectral component.

The following examples are intended to explain the invention without limiting it. In particular, the features, properties and advantages described therein of the defined compounds on which the relevant example is based can also be applied to other compounds which are not described in detail, but fall within the scope of protection of the claims, unless stated otherwise elsewhere.

WORKING EXAMPLES

The following syntheses are carried out, unless indicated otherwise, in 3-necked round-bottomed flasks in air. The starting materials are, unless mentioned otherwise, purchased from ALDRICH or ABCR.

Example 1

Oxidation of Polyaniline Dispersions

1a) Using Hydrogen Peroxide 0.42 ml of a 30% hydrogen peroxide solution in water is added to 150 ml of a vigorously stirred dispersion of polyaniline-polystyrenesulfonic acid/indium complex (PANI-In-PSSH) (4% in water, the preparation is carried out analogously to WO 2007/020100, Example 7), and the mixture is stirred at 60° C. for 1 hour.

Viscosity: 3.18 mPas at 40 1/s; pH=1.55

1b) Using Hydrogen Peroxide

Analogously to Example 1a, 0.85 ml of a 30% hydrogen peroxide solution in water is added to 150 ml of a vigorously stirred dispersion of polyaniline-polystyrenesulfonic acid/indium complex (PANI-In-PSSH), and the mixture is stirred at 60° C. for 1 hour.

Viscosity: 2.98 mPas at 40 1/s; pH=1.39

1c) Using Potassium Permanganate

Analogously to Example 1a, 1.27 g (8 mmol) of potassium permanganate are added to 150 ml of a vigorously stirred dispersion of polyaniline-polystyrenesulfonic acid/indium complex (PANI-In-PSSH), and the mixture is stirred at 60° C. for 1 hour. The dispersion is filtered through a 0.5 µm filter.

Viscosity: 3.01 mPas at 40 1/s; pH=1.52

1d) Using Potassium Peroxodisulfate

Analogously to Example 1a, 2.16 g (4 mmol) of potassium peroxodisulfate are added to 150 ml of a vigorously stirred dispersion of polyaniline-polystyrenesulfonic acid/indium complex (PANI-In-PSSH), and the mixture is stirred at 60° C. for 1 hour.

Viscosity: 2.90 mPas at 40 1/s; pH=1.51

1e) Using Peracetic Acid

Analogously to Example 1a, 1.33 ml (8 mmol) of 32% peracetic acid (in acetic acid) are added to 150 ml of a vigorously stirred dispersion of polyaniline-polystyrenesulfonic acid/indium complex (PANI-In-PSSH), and the mixture is stirred at 60° C. for 1 hour.

Viscosity: 3.21 mPas at 40 1/s; pH=1.74

1f) Using Sodium Hypochlorite

Analogously to Example 1a, 5.9 ml (8 mmol) of 10% sodium hypochlorite solution (in water) are added to 150 ml of a vigorously stirred dispersion of polyaniline-polystyrenesulfonic acid/indium complex (PANI-In-PSSH), and the mixture is stirred at 60° C. for 1 hour.

Viscosity: 2.88 mPas at 40 1/s; pH=1.39

1g) Using Ozone

Ozone (~10 g of $O_3$) is passed through 150 ml of a vigorously stirred dispersion of polyaniline-polystyrenesulfonic acid/indium complex (PANI-In-PSSH) by means of an ozone generator (Innovatec-CMG 10-4) for one hour.

In order to remove the excess ozone, the mixture is flushed with nitrogen for one hour.

Viscosity: 3.21 mPas at 40 1/s; pH=1.29

Example 2

Oxidation of poly(3,4-ethylenedioxy)thiophene polystyrenesulfonate (PEDOT-PSSH)

2a) Using Hydrogen Peroxide 0.1 ml of a 30% hydrogen peroxide solution in water is added to 100 ml of a vigorously stirred dispersion of PEDOT-PSSH (1.7% in water, PEDOT/PSSH 1/6, the material is purchased from H. C. Starck under the name Clevios A14083), and the mixture is stirred at 60° C. for 1 hour.

Viscosity: 7.18 mPas at 40 1/s; pH=2.03

Example 3

Oxidation of phenyltetraaniline-5-sulfosalicylic acid

3a) Using t-Butyl Hydroperoxide

This reaction is carried out under a blanket of $N_2$.

2.9 ml of a 5.5 M tert-butyl hydroperoxide solution in decane are added to 100 ml of a vigorously stirred solution of phenyltetraaniline-5-sulfosalicylic acid (5% in 1,3-dimethyl-2-imidazolidone/cyclohexanol mixture 1:1, preparation see EP 1773102, Example 1), and the mixture is stirred at 60° C. for 1 hour.

Viscosity: 1.28 mPas at 40 1/s; pH=3.32

Use Examples

Figure 1:
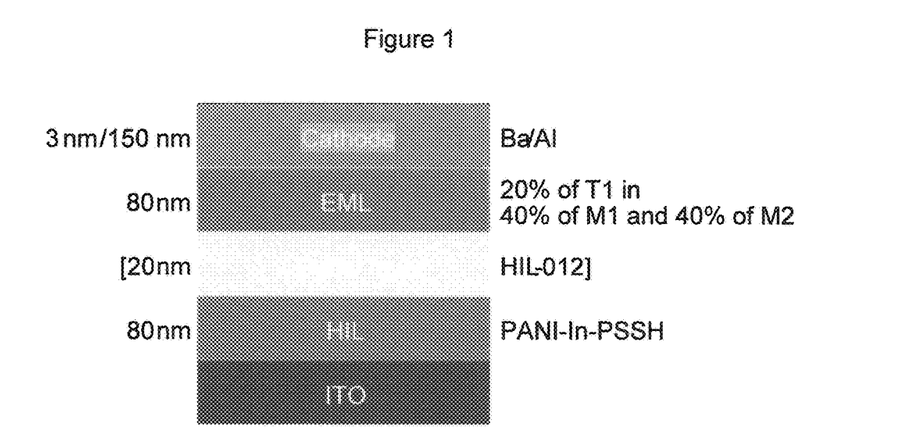
FIG. 1 show a structure of a typical OLED processed from solution.

Solution-processed OLEDs generally have a simpler structure than devices produced in vacuo. The latter comprise a multiplicity of layers having different functions. The individual layers are applied one on top of the other by vapour deposition, where the first layer, which is applied to the anode (generally ITO), is frequently a hole-injection layer ("HIL"). FIG. 1 depicts the structure of a typical OLED processed from solution, which comprises few layers. The production of such components is based on the production of polymeric light-emitting diodes (PLEDs), which has already been described multiple times in the literature (for example in WO 2004/037887 A2). Here too, the first layer, which is deposited on the anode, is a hole-injection layer, which is frequently also known as buffer layer. The materials according to the invention can be employed in devices of both types.

Comparative Example V1

Figure 3:
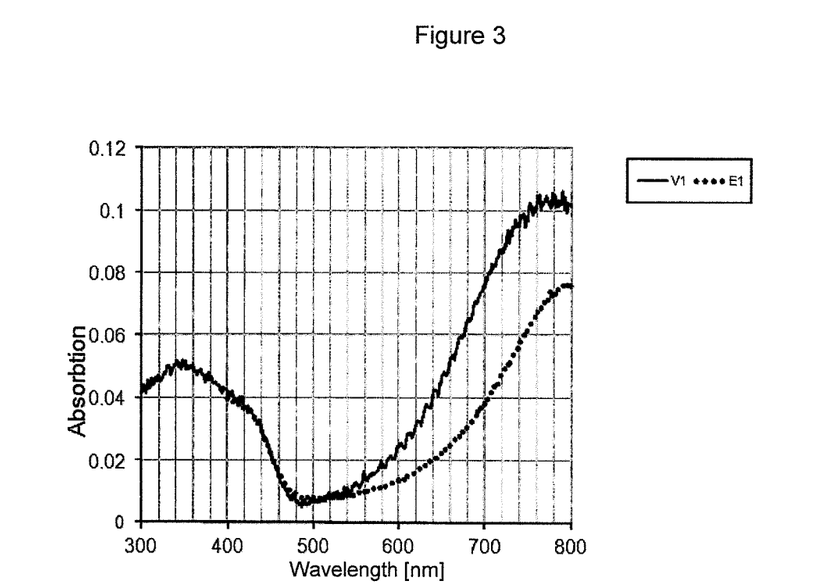
FIG. 3 shows the measured absorption spectrum.

A layer of polyaniline-polystyrenesulfonic acid/indium complex (4% in water, the preparation is carried out analogously to WO 2007/020100, Example 7) with a thickness of 80 nm is deposited on a glass support with the aid of a spin coater at a spin rate of 2530 rpm and dried by heating at 180° C. for 10 minutes. The film is subsequently protected against water (argon transport box). The measured absorption spectrum is depicted in FIG. 3.

Example E1

A film according to the invention of the dispersion from Example 1a is deposited on a glass support in the same manner as in Comparative Example V1. The spin rate required for 80 nm is 2300 rpm. The film is likewise dried by heating at 180° C. for 10 minutes and protected against water. The measured absorption spectrum is depicted in FIG. 3. The absorption in the red spectral region is significantly reduced.

Comparative Example V2

In the device configuration of FIG. 1, which is typical of solution-processed devices, firstly an interlayer, in this case HIL-012 (0.5% from toluene) (Merck KGaA), is applied to the buffer layer, which has been deposited analogously to Comparative Example V1. The spin rate required for a 20 nm interlayer is 2440 rpm, the interlayer film is dried by heating at 180° C. under a protective-gas atmosphere for one hour after the spin coating.

Example E2

On use of the dispersion according to the invention from Example 1a, the spin rate for the interlayer (HIL-012) is 2380 rpm, i.e. it is thus virtually identical to the spin rate for Comparative Example V2. This means that the surface tension and thus the wettability of the film is also not changed measurably by the use of the dispersions according to the invention.

Examples E3 to E5, V3: Production of Solution-Processed OLEDs

Solution-processed OLEDs can be produced using the formulations according to the invention in the device structure of FIG. 1 both with and without interlayer. The interlayer material used in each case is HIL-012 from Merck. The emission layer ("EML", see FIG. 1) is in both cases a layer with a thickness of 80 nm applied by spin coating. The materials used in the emission layer are a green triplet emitter T1 in a matrix of components M1 and M2. The solvent is chlorobenzene, the proportions of the individual materials are 20% by weight of T1, 40% by weight of M1 and 40% by weight of M2.

Structure of Emitter T1:

Structure of Matrix M1:

Structure of Matrix M2:

Example E3: OLED in Device Structure of FIG. 1 (with Interlayer)

Figure 2:
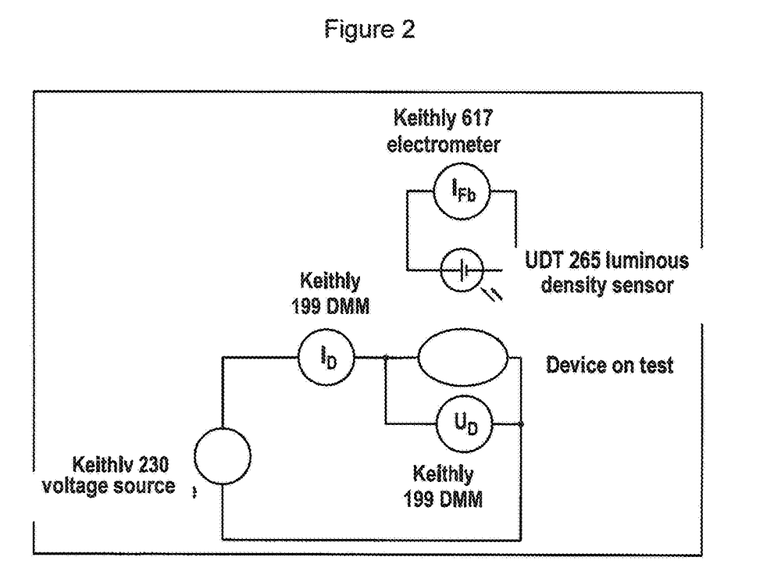
FIG. 2 shows an exemplary measurement set-up for characterizing device.

The spin rate required for an 80 nm EML layer on HIL-012 is 1010 rpm. In order to obtain a qualitatively high-quality film, the solution is warmed to 60° C. and applied by spin coating at this temperature. After the spin coating, the film is dried by heating at 180° C. on a hotplate for 10 minutes under protective-gas atmosphere. 3 nm of barium and 150 nm of aluminium are applied by vapour deposition as cathode. The devices encapsulated after the sample production are characterised using a measurement set-up as depicted in FIG. 2. In addition, an electroluminescence spectrum is measured at 1000 cd/m$^2$, from which the colour coordinates are derived (CIE: Commission Internationale de l'Eclairage, 1931 standard observer). The lifetime ("LT") of the devices is likewise measured, where the lifetime of the device is taken to mean the time after which the initial luminous density (in this case 1000 cd/m$^2$) has dropped to 50%. The results in Table 1 show that the dispersion of Example 1b according to the invention, in spite of the simple device structure, results in very good triplet green devices.

TABLE 1

| | Device results for E3 | | | | |
|---|---|---|---|---|---|
| Ex. | Max. eff. [cd/A] | Max. EQE [%] | U @ 1000 cd/m$^2$ [V] | CIE [x/y] | LT @ 1000 cd/m$^2$ [hrs] |
| E3 | 26.1 | 7.3 | 6.7 | 0.34/0.62 | 6500 |

Examples V3, V4, E4 to E6: OLEDs in Device Structure of FIG. 1 (without Interlayer)

Even less expensive and more robust to produce is a device structure as in FIG. 1, in which the interlayer is omitted. If the EML is applied directly to the PANI-In-PSSH layer also used for Comparative Example V1, a very simple green OLED (Comparative Device Example V3) is obtained. As a further comparative example, PEDOT can additionally be used as buffer material (Comparative Device Example V4). The latter is likewise purchased as an aqueous dispersion from Heraeus (Clevios P 4083 Al) and is processed and dried by heating analogously to the PANI dispersion (spin rate for 80 nm: 4500 rpm). For comparison, devices comprising buffer layers 1a, 1b and 1f according to the invention are constructed (Examples E4, E5 and E6). The results are summarised in Table 2. The spin rates of the EML on the buffer layer are all very close together, which in turn shows that the adhesion of the EML to the layers according to the invention is just as good as to the PEDOT which is widespread in industry. The lifetime ("LT") of the devices is likewise measured, where the lifetime of the device is taken to mean the time after which the initial luminous density (in this case 1000 cd/m$^2$) has dropped to 50%.

TABLE 2

Device results for V3, V4, E4, E5 and E6

| Ex. | Spin rate of EML [rpm] | Max. eff. [cd/A] | Max. EQE [%] | U @ 1000 cd/m$^2$ [V] | CIE [x/y] | LT @ 1000 cd/m$^2$ [hrs] |
|---|---|---|---|---|---|---|
| V3 | 1010 | 16.7 | 4.7 | 7.0 | 0.34/0.62 | 1600 |
| V4 | 1200 | 22.5 | 6.2 | 6.5 | 0.33/0.62 | 1300 |
| E4 | 1210 | 21.8 | 6.0 | 6.2 | 0.34/0.62 | 2300 |
| E5 | 1210 | 29.7 | 8.2 | 6.6 | 0.34/0.62 | 5600 |
| E6 | 1210 | 21.4 | 5.7 | 7.1 | 0.34/0.62 | 2500 |

As can be seen from the results of Table 2, the use of formulations 1a, 1b and 1f according to the invention in devices E4 to E6 in all cases results in a significant improvement compared with the prior art, device V3. In spite of the omission of the interlayer, the lifetime of device E5 is virtually the same as that of device E3, the efficiency is even improved again in comparison.

Figure 4:
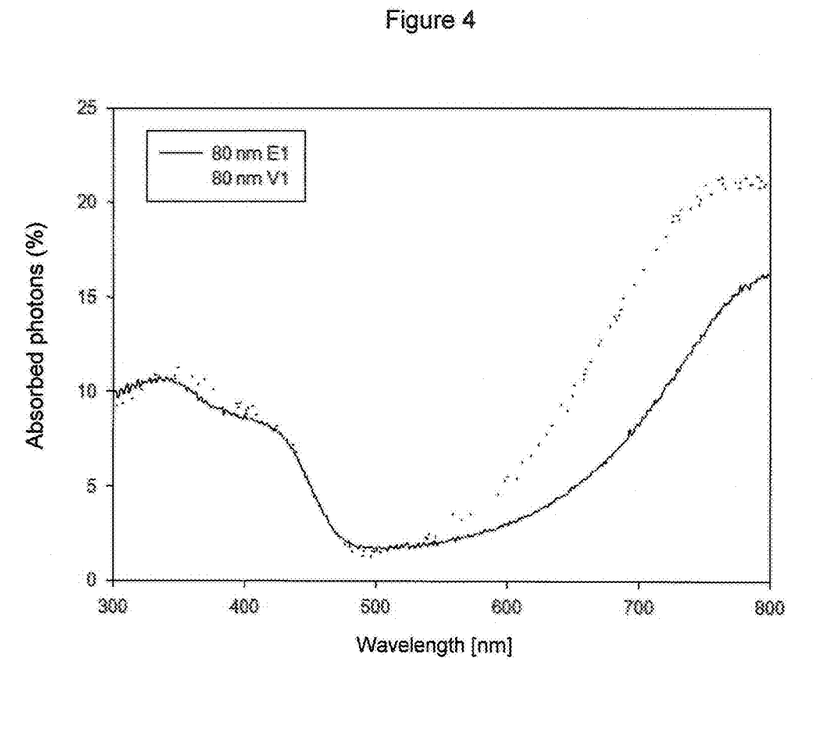
FIG. 4 shows the number of photons absorbed versus wavelength in comparison to prior art.

Comparison of EL Spectra of White Devices on V1 and E1:

If the transmission of the films [T=10$^{(-E)}$] is calculated from the absorption spectrum in FIG. 3 and the number of photons absorbed by the film [(1−T)−100] resulting therefrom is subsequently calculated, it becomes clear how great the difference and thus the influence on the spectral window is for the films produced from the formulations according to the invention compared with the prior art (see FIG. 4). Whereas the film from V1 absorbs, for example, 20% of all photons at 780 nm, this is only 15% in the case of the film from E1. For rich-red devices having an emission wavelength of 625 nm, V1 absorbs about 7.2%, but E1 only about 3.9%. Table 3 shows the proportion of absorbed photons for various selected wavelengths.

TABLE 3

| Wavelength | V1 | E1 |
|---|---|---|
| 440 nm | 6.48% | 6.50% |
| 500 nm | 1.48% | 1.68% |
| 550 nm | 2.88% | 2.09% |
| 580 nm | 4.23% | 2.57% |
| 625 nm | 7.19% | 3.87% |

Figure 5:
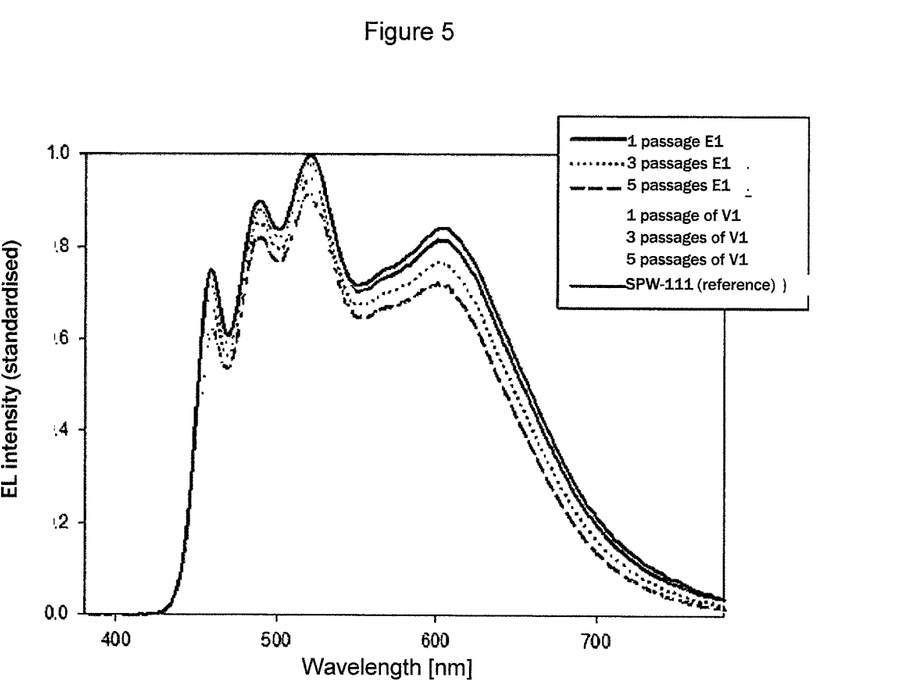
FIG. 5 shows the EL spectrum of an SPW-111 device as would change after one, three and five passages through the V1 or E1 layer.

In particular, the high absorption in the yellow-red region is of crucial importance for use of the layers in devices for lighting applications, where it is desired to construct so-called "warm-white" lighting elements with a high orange content. The general problem arises here that the red emission usually exhibits lower efficiencies, especially compared with green, and in addition, in order to be able to compete with existing lighting technology (incandescent bulbs, energy-saving lamps, LEDs) in respect of energy consumption, use is often made of coupling-out optics in which the layer may be passed through multiple times. FIG. 5 shows the EL spectrum of an SPW-111 device (a white OLED polymer obtainable from Merck) as would change after one, three and five passages through the V1 or E1 layer. To this end, an EL spectrum of a standard SPW-111 device (processed from solution, as described in WO 2004/037887 A2) standardised to 1 was in each case multiplied by the transmission of V1 or E1 for the number of passages. Apart from the general loss of efficiency, the colour shift for the buffer layer in accordance with the prior art V1 is striking, the red content in the spectrum drops massively. The same is of course also the case in the much simpler case of a thicker buffer layer, as is readily employed in large-scale industrial processes for reasons of production yield. Layer thicknesses of 200 to 250 nm are typical here, which corresponds arithmetically approximately to the spectra for 3 passages (dotted spectra). Here too, the colour change and the loss of the red content should already be clearly noted.

The invention claimed is:

1. A formulation consisting essentially of at least one doped, conductive polymer, at least one oxidant and at least one solvent, wherein the at least one solvent is water, wherein the content of water in the formulation is in the range from 65 to 99.99% by weight, and wherein the content of the at least one oxidant in the formulation is in the range from 0.05 to 5% by weight.

2. The formulation according to claim 1, wherein the conductive polymer is selected from the group consisting of polythiophene, polythiophene derivative, polyaniline, polyaniline derivative, polypyrrole, and oligoaniline.

3. The formulation according to claim 1, wherein the content of the at least one doped, conductive polymer in the formulation is in the range from 0.001 to 30% by weight.

4. The formulation according to claim 1, wherein at least one oxidant is selected from the group consisting of organic and inorganic peroxides, peracids, persulfates, perborates, metal salts, derivatives of halogen oxyacid, nitrates, halogens, ozone, nitrogen oxides, nitroso compounds, and oxygen.

5. The formulation according to claim 1, wherein the weight ratio of doped, conductive polymer to oxidant in the formulation is in the range from 1000:1 to 1:10.

6. A method comprising incorporating the formulation according to claim 1 in organic, electronic devices.

7. The method according to claim 6, wherein the organic, electronic device is an electroluminescent device.

8. The formulation according to claim 1, wherein the conductive polymer is polyaniline, and wherein at least one oxidant is hydrogen peroxide or sodium hypochlorite.

9. A formulation consisting essentially of at least one doped, conductive polymer, at least one oxidant selected from the group consisting of organic and inorganic peroxides, peracids, persulfates, perborates, metal salts, derivatives of halogen oxyacid, nitrates, halogens, ozone, nitrogen oxides, nitroso compounds, and oxygen, and at least one solvent, wherein the at least one solvent is water, wherein the content of water in the formulation is in the range from 65 to 99.99% by weight, and wherein the content of the at least one oxidant in the formulation is in the range from 0.05 to 5% by weight.

* * * * *